United States Patent [19]
Yamashita et al.

[11] Patent Number: 5,621,982
[45] Date of Patent: Apr. 22, 1997

[54] ELECTRONIC SUBSTRATE PROCESSING SYSTEM USING PORTABLE CLOSED CONTAINERS AND ITS EQUIPMENTS

[75] Inventors: Teppei Yamashita; Masanao Murata; Tsuyoshi Tanaka; Teruya Morita; Hitoshi Kawano; Mitsuhiro Hayashi; Atsushi Okuno; Akio Nakamura, all of Ise, Japan

[73] Assignee: Shinko Electric Co., Ltd., Tokyo, Japan

[21] Appl. No.: 329,904

[22] Filed: Oct. 27, 1994

Related U.S. Application Data

[62] Division of Ser. No. 104,472, Jul. 28, 1993.

[30]   Foreign Application Priority Data

| Jul. 29, 1992 | [JP] | Japan | 4-202660 |
| Aug. 7, 1992 | [JP] | Japan | 4-211546 |
| Aug. 20, 1992 | [JP] | Japan | 4-221474 |
| Aug. 20, 1992 | [JP] | Japan | 4-221475 |

[51] Int. Cl.⁶ .................................................. F26B 19/00
[52] U.S. Cl. .................... 34/203; 34/211; 34/216
[58] Field of Search .......................... 34/203, 209–11, 34/215–18, 235, 236, 107; 29/25.01; 118/715, 719

[56]   References Cited

U.S. PATENT DOCUMENTS

| 5,303,482 | 4/1994 | Yamashita et al. | 34/218 |
| 5,363,867 | 11/1994 | Kawano et al. | 34/218 |

*Primary Examiner*—John M. Sollecito
*Assistant Examiner*—Steve Gravini
*Attorney, Agent, or Firm*—Bacon & Thomas

[57]   ABSTRACT

Disclosed is an electronic substrate processing system comprising a processing equipment for processing electronic substrates including semiconductor wafers and liquid crystal substrates; a cleaning equipment for cleaning said electronic substrate in a predetermined processing step; a portable closed container for accommodating a cassette containing said electronic substrate; a purging station for gas-purging said portable closed containers; and a storage member for storing said portable closed containers, wherein said cassette accommodates said electronic substrates which have been cleaned by said cleaning equipment being set in said portable closed container and purged with an inert gas in said purging station, and said portable closed container or containers is stored in said storing section when necessary.

8 Claims, 15 Drawing Sheets

ELECTRONIC SUBSTRATE PROCESSING SYSTEM USING PORTABLE CLOSED CONTAINERS AND ITS EQUIPMENTS

This application is a division of application Ser. No. 08/104,472, filed Jul. 28, 1993.

BACKGROUND OF THE INVENTION

1. Field of the Invention

This invention relates to an electronic substrate processing system in a clean room, and its equipments.

2. Prior Art

Electronic substrates such as semiconductor wafers are manufactured in a clean room, the atmosphere in which has been cleaned. The manufacture is increased in yield by increasing the cleanliness of the atmosphere.

On the other hand, recently semiconductor integrated circuits have been increased in the degree of integration. In association with this increase, a so-called "local clean system" has been employed in which electronic substrates such as semiconductor wafers are set in a portable closed container when conveyed. For instance in a processing step in which a thin film forming deposition system (CVD, PVD or the like) is carried out for wafers, the degree of growth of a native oxide film on the wafers, or the contamination of the wafers by metal ions contained in the air cannot be neglected; that is, the exposure of the wafers in the air cannot be neglected in manufacture of the wafers.

Prior to the thin film deposition system, the wafer is cleaned with a cleaning equipment. This wafer cleaning operation should be carried out with the thin film deposition system taken into account because the thin film deposition system takes a relatively long period of time, several tens of minutes to several hours, for the following reasons: A native oxide film grows on the cleaned wafer quickly; that is, the cleaned wafer is liable to be contaminated by the ions in the air. Therefore, if, in the thin film deposition system, wafers to be processed next are exposed in the internal atmosphere, then a native oxide film grows on them (the percentage of growth of the native oxide film being increased abruptly in about one hour exposure), and they are progressively contaminated by the metal ions.

Sometimes the cleaning operation by the cleaning equipment takes several tens of minutes. Hence, in the conventional processing system, the processing operation is less in the degree of freedom, and therefore it is difficult to increase the productivity.

SUMMARY OF THE INVENTION

In view of the forgoing the problem, an object of this invention is to eliminate the above-described difficulties accompanying a conventional electronic substrate processing system. More specifically, an object of the invention is to provide an electronic substrate processing system using a portable closed container, and its equipments in which, with the time limitation in operation between the equipments eliminated, the processing operation is increased in the degree of freedom, and the productivity is increased as much.

According to first aspect of the present invention, an electronic substrate processing system comprises a processing equipment for processing electronic substrates including semiconductor wafers and liquid crystal substrates; a cleaning equipment for cleaning said electronic substrate in a predetermined processing step; a portable closed container for accommodating a cassette containing said electronic substrate; a purging station for gas-purging said portable closed containers; and a storage member for storing said portable closed containers, wherein said cassette accommodates said electronic substrates which have been cleaned by said cleaning equipment being set in said portable closed container and purged with an inert gas in said purging station, and said portable closed container or containers is stored in said storing section when necessary.

According to second aspect of the present invention, a purging station comprises an independent casing having a container carry-in/carry-out opening; a purging unit provided in said casing, said purging unit having a container stand; a portable closed container including a container body and a bottom lid for storing and conveying and a cassette which accommodates electronic substrates, said cassette being placed on said container stand; a container body lifting unit for lifting said container body; purging pipes first ends of which are opened in said purging unit; and a purging control unit for controlling said purge station, wherein said purging unit incorporates a purging mechanism which operates to open and close the bottom lid of said container on said container stand to selectively communicate the inside of said container with the inside of said purging unit.

According to third aspect of the present invention, a purging station comprises an independent casing having a container or cassette carry-in/carry-out window; a container stand provided in said casing; a portable closed container including a container body and a bottom lid for storing and conveying and a cassette which accommodates electronic substrates, said cassette being placed on said container stand; a container lid opening and closing mechanism for opening said bottom lid; purging pipes first ends of which are opened in said casing; and a purging control unit for controlling said purging station.

A fourth aspect of the present invention, a purging station comprises a purging chamber provided in a purging unit having an opening, a periphery of said purging unit serving a container stand on which a portable closed container is set; purging pipes, first ends of which are opened in said purge chamber; a purging control unit for controlling said purge unit; and a purging mechanism for opening and closing said bottom lid of said container on said container stand to selectively communicate an inside of said container with an inside of said purging chamber, wherein said purging chamber is defined in said purging unit, which includes an independent casing, by a skirt which is provided in such a manner said skirt gas-tightly covers said opening of said purging unit from inside, and said casing having a cassette carry-in/carry-out window.

According to fifth aspect of the present invention, an electronic substrate cleaning equipment comprises a cleaning equipment for cleaning substrates for electronic equipment which are set in a cassette being carried thereinto through a cassette carry-in opening of a casing thereof, said cassette being carried by a portable closed container, said substrates being cleaned in a predetermined cleaning step; purging means for purging said portable closed container with a gas which is inactive with said substrates accommodated in a portable closed container, said purging means mounted in said casing; and means for setting in a portable closed container said cassette which has been finally processed in said cleaning step, wherein said casing has a carry-in/carry-out opening for said portable closed container.

According to sixth aspect of the present invention, a gas-purging equipment comprises a portable closed container for accommodating and conveying electronic substrates; a gas purging unit for evacuating and subsequently purging said portable closed container with a gas which is inactive with said electronic substrates, said gas-purging unit being connected through pipes to a vacuum source and an inert gas source, and said gas-purging unit being divided with a wall to form a gas-purging unit body and a container accommodating section, said wall having a through-hole through which said gas purging unit body section and said container accommodating section are communicated with each other, wherein after said portable closed container is set on said wall, said bottom lid of said container is opened so as to communicate said inside of said container with said inside of said gas-purging unit body whereby said inside of said portable closed container is evacuated and purged with one of an insert gas and a heated inert gas.

In the system of the invention, the cassette is set in the closed container when moved between the equipments. Therefore, the electronic substrates are never exposed in the atmosphere in the clean room. Furthermore, the cassette is stored in the closed container which has been gas-purged. The container can be gas-purged at the purging station when necessary. The time limitation in operation between the equipments is eliminated, and the processing operation is increased in the degree of freedom.

DETAILED DESCRIPTION OF THE PREFERRED EMBODIMENTS

One preferred embodiment of this invention will be described with reference to the accompanying drawings.

Figure 1:
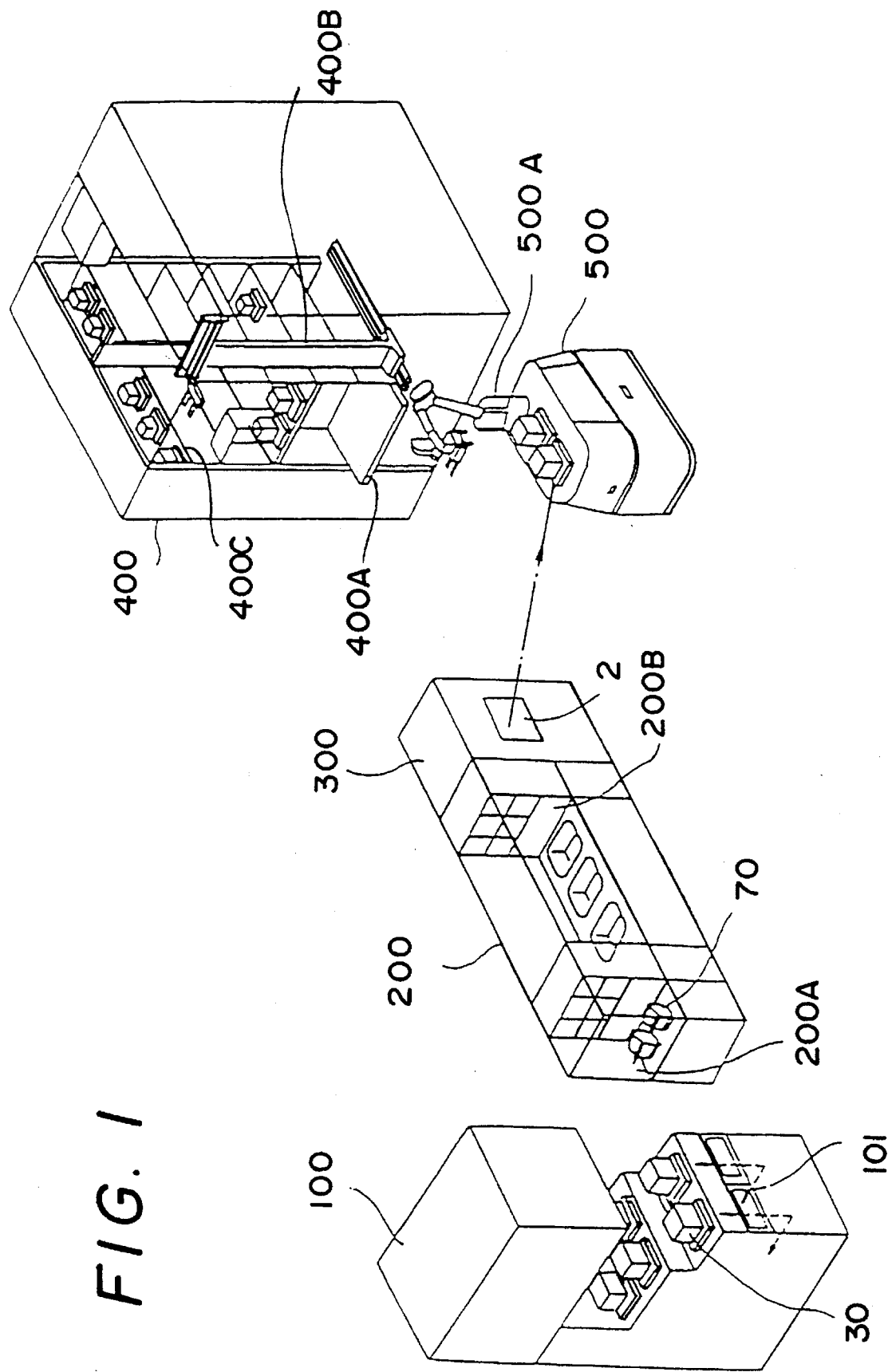
FIG. 1 is a perspective view showing the layout of an electronic substrate processing system, which constitute one embodiment of this invention.

In FIG. 1, reference numeral 100 designates a film forming deposition system arranged in a clean room; 200, a wafer cleaning device; 300, a purging Station; 400, a clean stocker; 500, a transfer robot on which a product placing device is mounted; and 30, a portable closed container.

Figure 2:
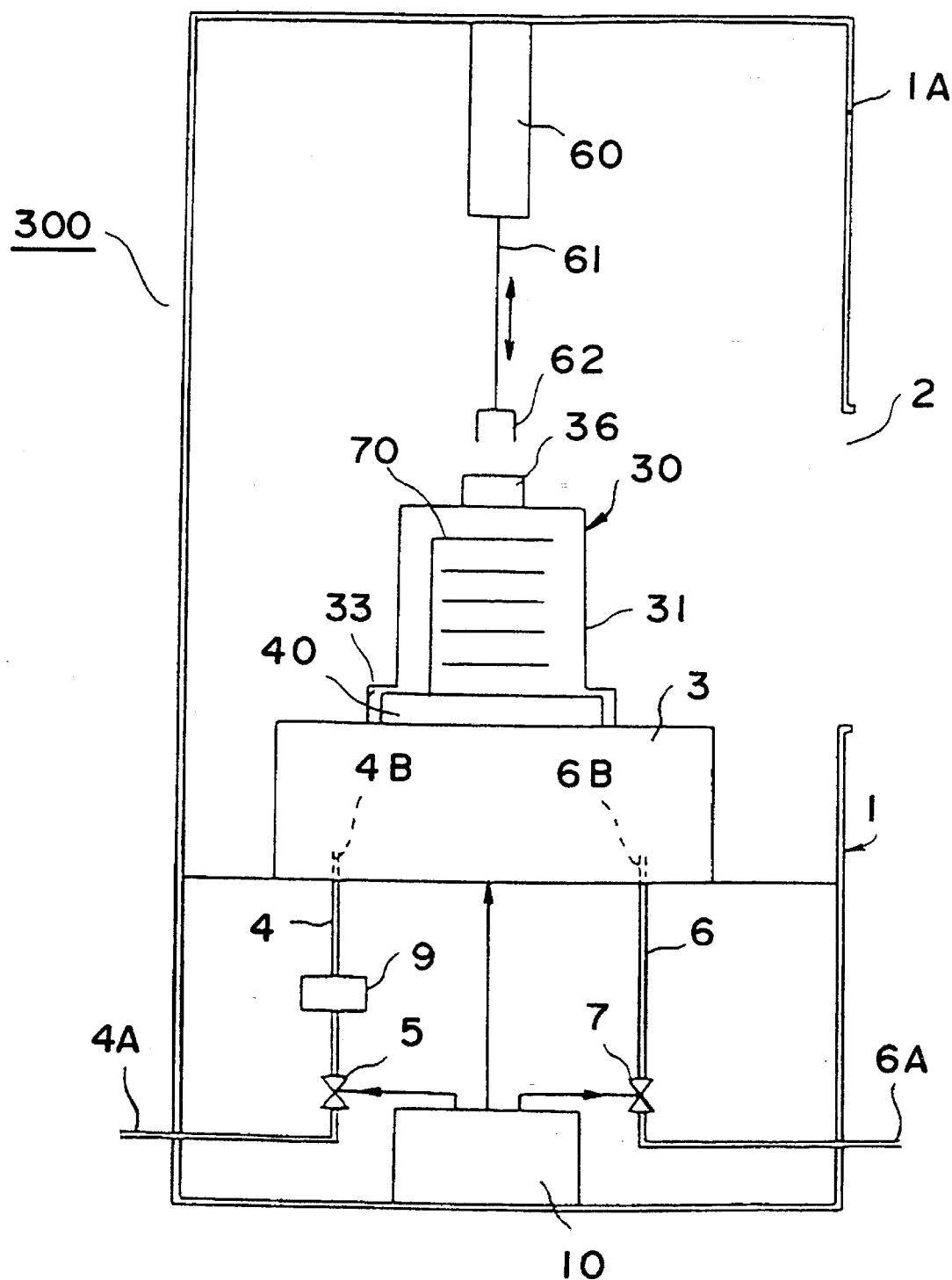
FIG. 2 is an explanatory diagram showing a first example of a purging station in the system of the invention.

FIG. 2 shows one example of the purging station.

Figure 3:
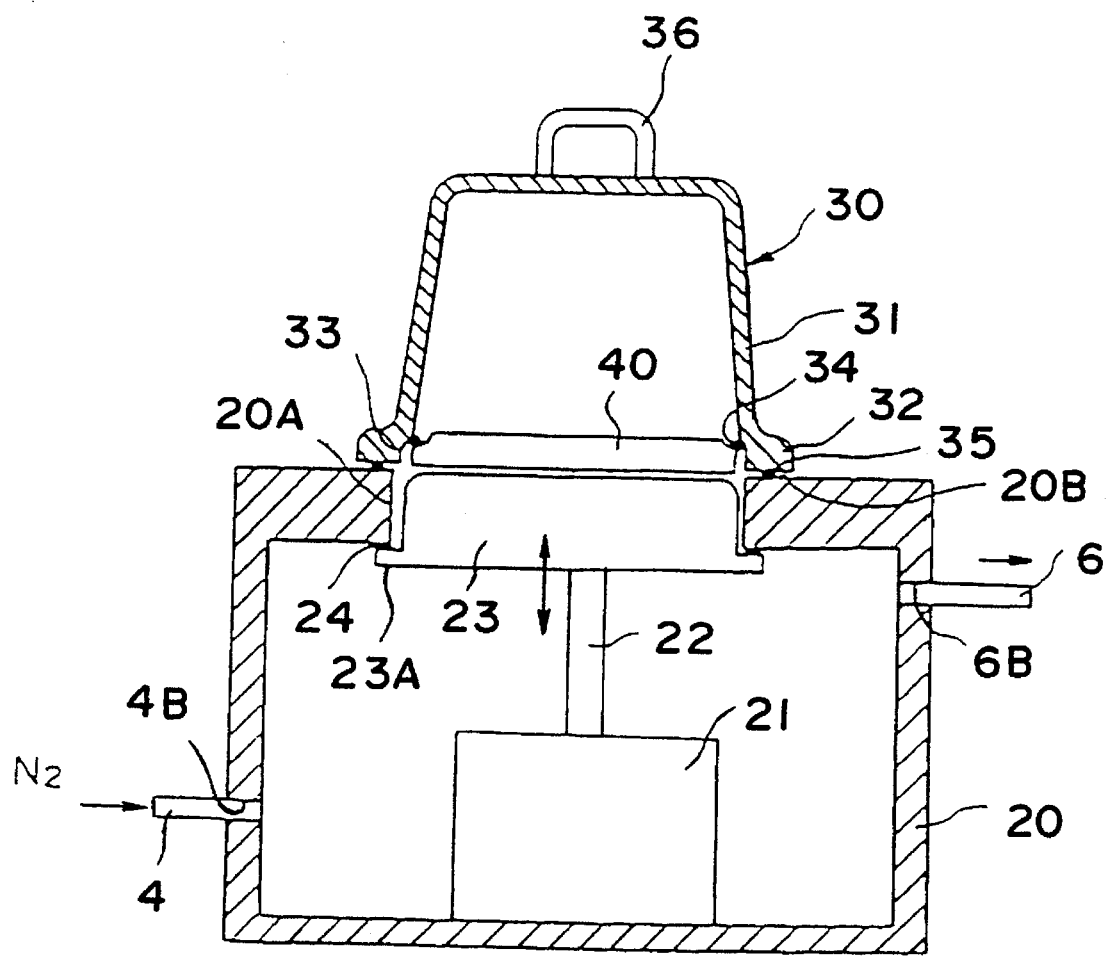
FIG. 3 is an explanatory diagram showing a closed container and a first example of a purging unit in the system of the invention.

In FIG. 2, reference numeral 1 designates a parallelopiped casing having a window in its front wall 1A; 3, a first example of a purging unit. The purging unit 3, as shown in FIG. 3, has a closed box 20 in which a container opening and closing mechanism is provided to selectively communicate the inside of the closed box 20 with the inside of the portable closed container 30. Reference numeral 4 designates a gas supplying pipe. One end portion 4A of the pipe 4 is extended outside the casing 1, and the other end portion 4B is opened in the closed box 20. The pipe 4 has an electromagnetic control valve 5 at the middle. Reference numeral 6 designates a gas discharging pipe. One end portion 6A of the pipe 6 is extended outside the casing 1, and the other end portion 6B is opened in the closed box 20. The pipe 6 has an electromagnetic control valve 7 at the middle. Further in FIG. 2, reference numeral 9 denotes a high performance filter; and 10, a purging unit controller which controls the operations of the electromagnetic control valves 5 and 7 and the operation of the above-described container opening and closing mechanism. Reference numeral 60 designates a container lifting unit for lifting a container body 31 (shown in FIG. 7). In the embodiment, the container lifting unit is of cylinder-operated type. The;one end portion 4A of the gas supplying pipe 4 is connected to an inert gas source. The one end portion 6A of the gas discharging pipe 6 is connected to an exhaust pipe or the like which is laid under the floor of the clean room.

Fans with filters (not shown) may be installed on the ceiling and the rear wall of the casing 1, to cause the clean air to flow upwardly and to flow from the rear side of the casing to the front side at all times. This is effective in eliminating the difficulty that, in placing a wafer cassette 70 in the container 31 inside the casing 1, dust in the atmosphere in the casing 1 sticks on the surfaces of the wafers W.

FIG. 3 shows the first example of the purging unit 3 in more detail.

In FIG. 3, reference numeral 21 designates a lifting unit; 22, a rod; and 23, a lifting stand. The lifting stand 23 includes a flange 23A which is larger in diameter than the opening 20A of the closed box 20. Normally, the lifting stand 23 is held fitted in the opening 20A in such a manner that the flange 23A pushes against the lower periphery of the opening 20A with a gap between the side wall of the lifting stand 23 and the opening 20A.

The body 31 of the portable closed container 30 has an opening 33 which is surrounded by a flange 32. Further in FIG. 3, reference numerals 34 and 35denote seal materials; 36, a handle, and 40, the bottom lid of the closed container.

Figure 4:
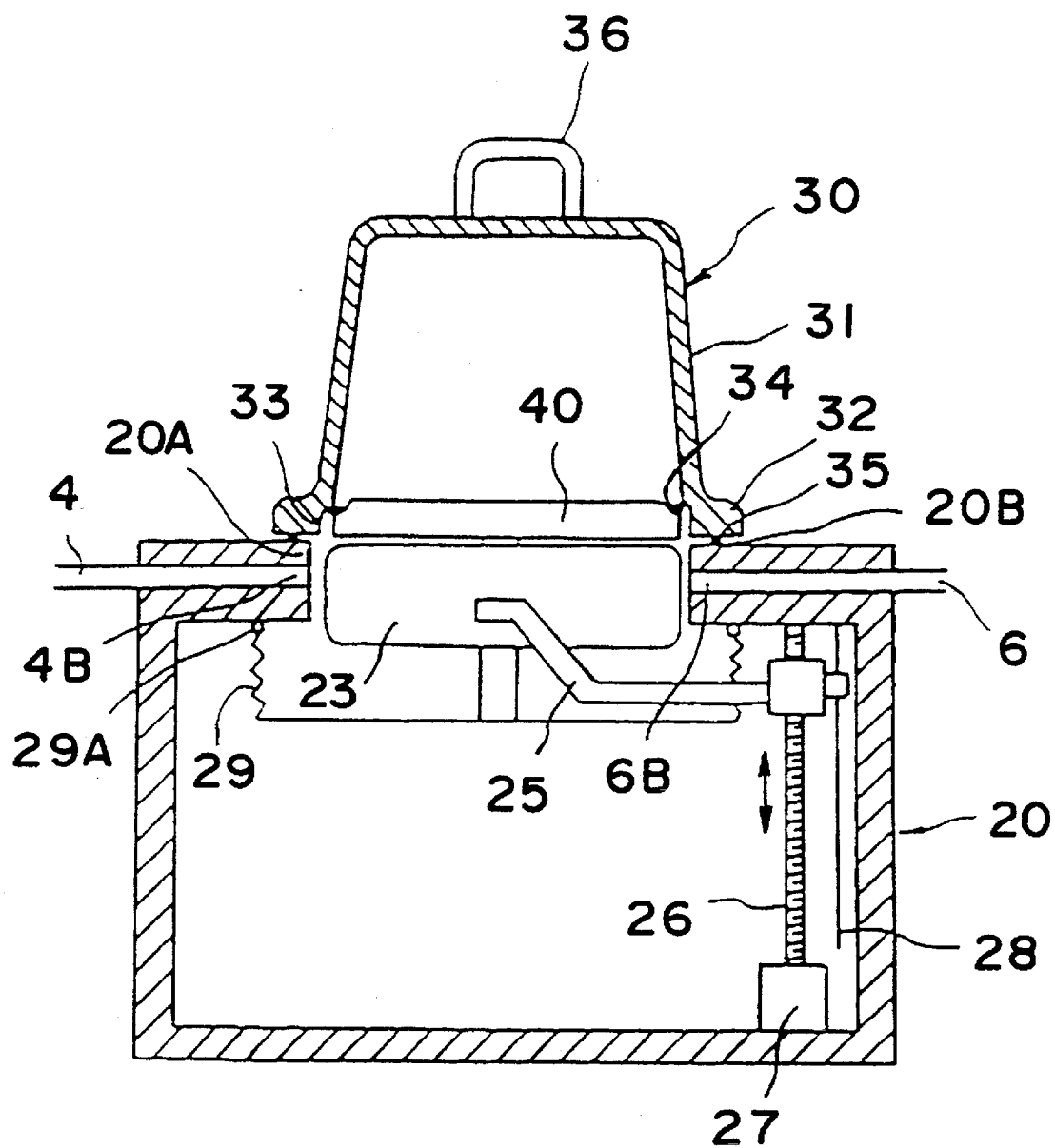
FIG. 4 is an explanatory diagram showing a second example of the purging unit.

FIG. 4 is a second example of the purging unit 3.

In the purging unit, a gas supplying pipe 4B and a gas discharging pipe 6B are opened in the closed box 20 in the vicinity of the opening 20A. The lifting stand 23 is moved vertically through an arm 25 by a ball screw 26, which is provided in the closed box 20 near one side. Those openings are covered with an elastic skirt of bellows-type 29, and isolated from the drive section of the lifting stand 23. Further in FIG. 4, reference numeral 27 designates an electric motor; and 28, a guide.

In the purging unit, the inert gas is jetted into the opening 20A, and it is caused to flow into the container when the lifting stand 23 is slightly lowered. In the purging unit, the inert gas is not filled in the whole of the closed box 20, which results in the economical use of the inert gas.

Figure 5:
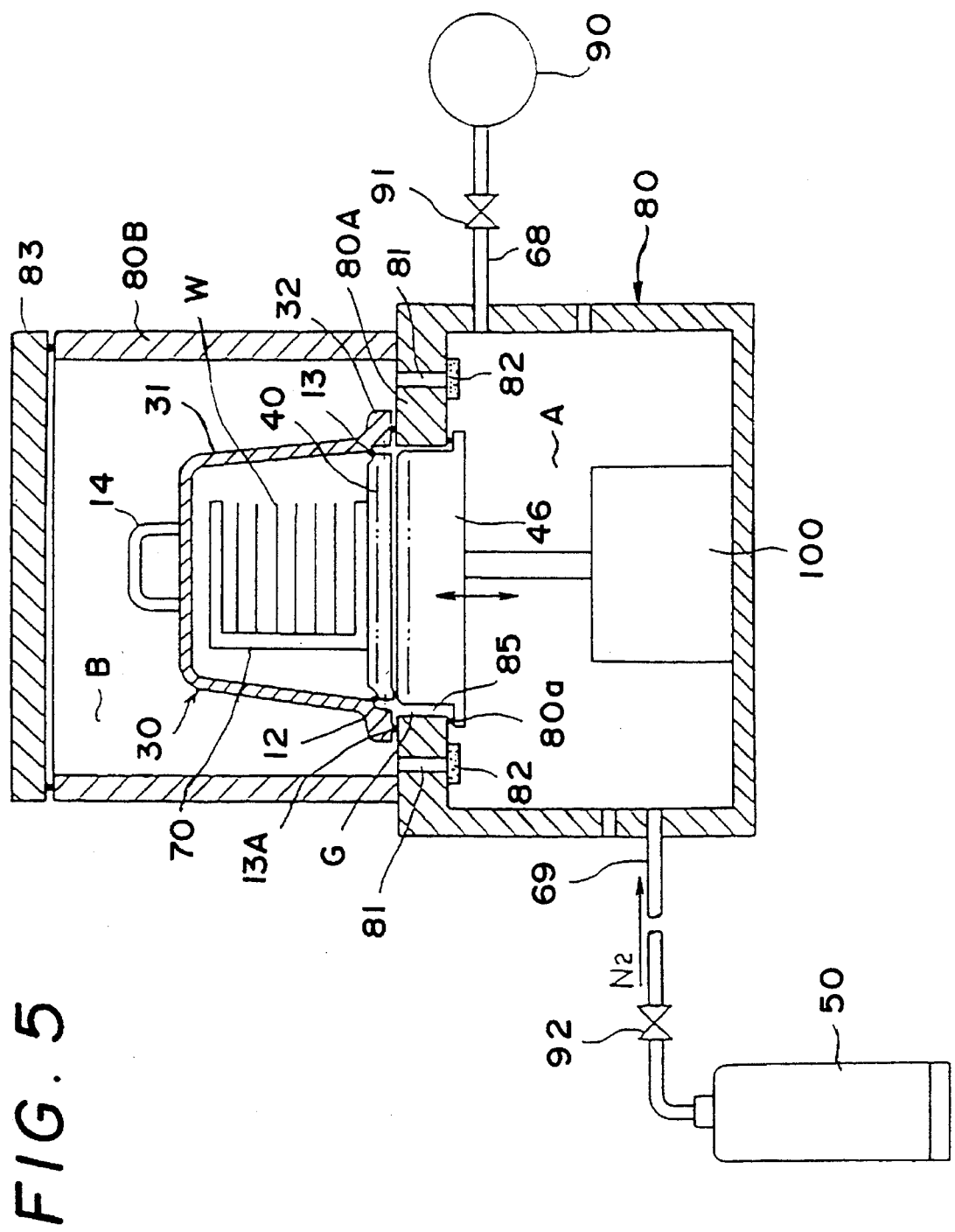
FIG. 5 is an explanatory diagram showing a third example of the purging unit.

FIG. 5 shows a third example of the purging unit.

Prior to the gas-purging of the container, it is necessary to evacuate the latter. In this evacuation of the container, the difference between the pressures inside and outside the container body cannot be neglected depending on the material of the container body. In order to solve this problem, in the third example of the purging unit, a container accommodating chamber for covering the container is provided. The container accommodating chamber is evacuated at the same time the container is evacuated.

In FIG. 5, reference character 80B designates a wall defining the container accommodating chamber B which is closed with a lid 83. The container accommodating chamber B is communicated with a purging chamber A through through-holes 81. Therefore, in evacuation and in gas-purging, the purging chamber A, the container accommodating chamber B, and the container body are communicated with one another; that is, the insides of them are equal in pressure. In FIG. 5, reference numeral 82 designates filters engaged with the through-holes 81.

Figure 6:
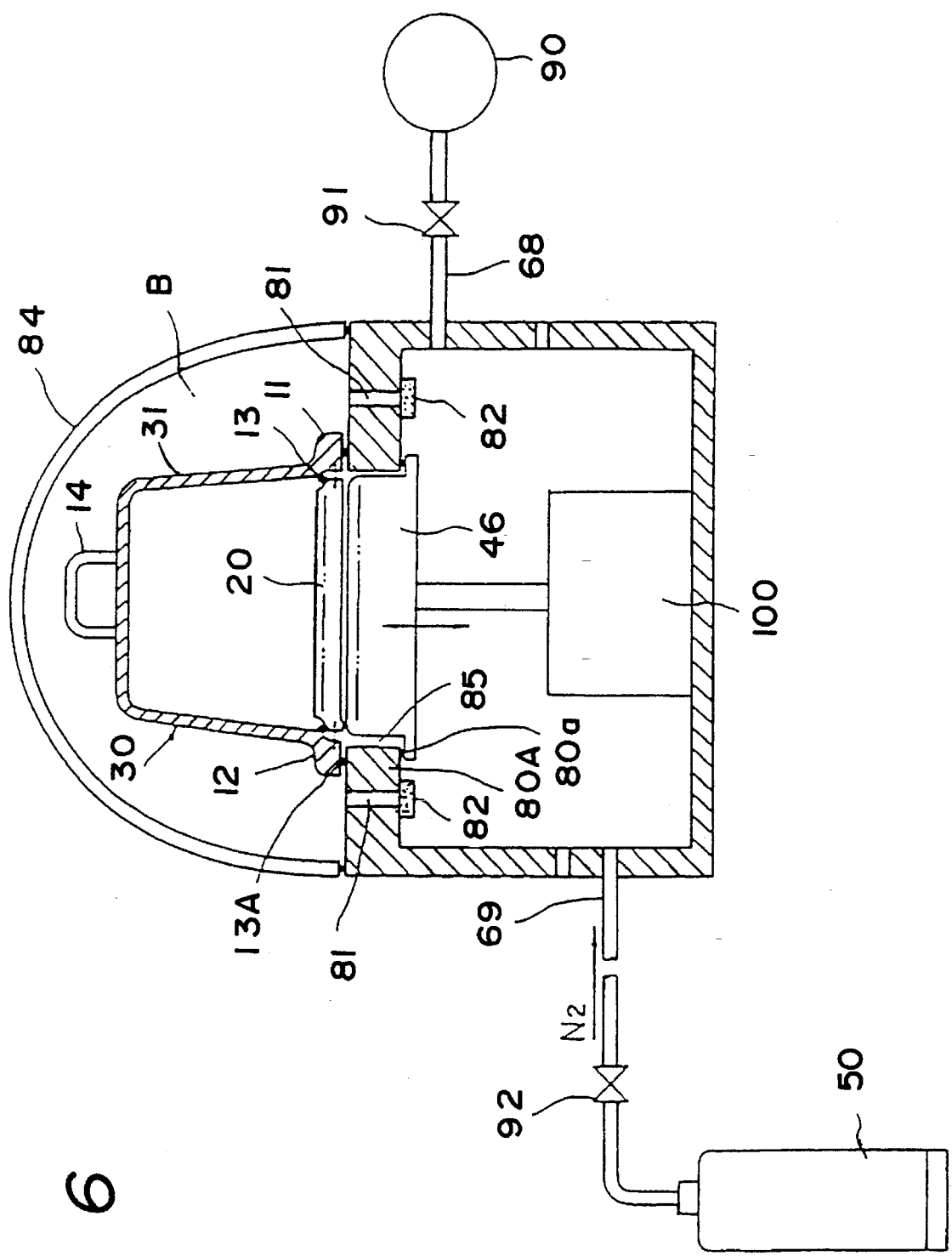
FIG. 6 is an explanatory diagram showing a fourth example of the purging unit.

FIG. 6 shows a fourth example of the purging unit.

In the purging unit shown in FIG. 6, its container accommodating chamber is formed by a semi-spherical cover 84. The cover 84 is semi-spherical, and therefore it can be relatively small in wall thickness with its mechanical strength maintained high. And for the same reason, it can be miniaturized.

Figure 7:
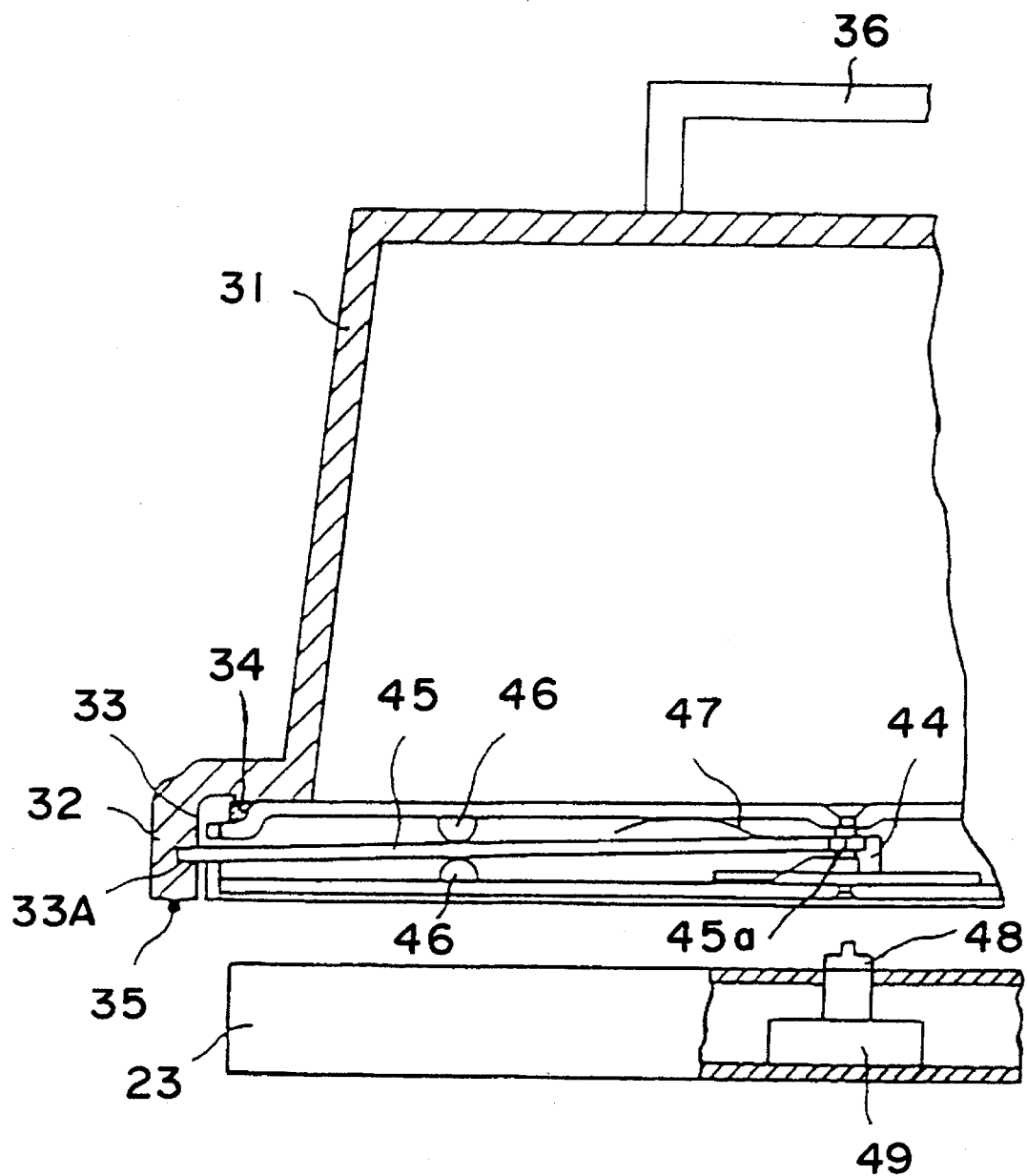
FIG. 7 is an explanatory diagram for a description of the structure of a locking/unlocking mechanism in the closed container.

In each of the above-described examples of the purging unit, the bottom lid 40 of the closed container is hollow, and has a lock mechanism as shown, for instance, in FIG. 7. In FIG. 7, reference numeral 44 designates a cam; 45, a plate-shaped lock arm having a rolling element 45a, the lock arm 45 being cantilevered in such a manner that it is movable and tiltable longitudinally; 46, fulcrum members; and 47, a spring. A cam shaft 48 is extended from the center of the upper wall of the lifting stand 23 into the bottom lid 40, and it is spline-engaged with the cam 44 when the bottom lid 40 is coaxially set on the lifting stand 23. The lifting stand 23 incorporates a cam shaft driving mechanism 49 for turning the cam shaft 48 through a predetermined angle. The cam shaft driving mechanism 49 and the cam shaft 48 form a locking/unlocking mechanism. The lock arm 45 is engaged with a recess 33A, which is formed in the inner surface of the flange 32 defining the opening 33 of the container body 31.

Next, in this configuration, the wafer cassette containing the wafers is transferred to the stand provided with the carry-in opening 200A of the wafer cleaning device 200 and transferred to the thin film deposition system 100.

The wafer cassette is handled as follows:

(1) The wafer cleaning device 200 has a plurality of chemical solution tanks, pure water tanks, and a drying section in its casing. Those tanks are arranged in a predetermined order. In the device 200, the wafer cassette is dipped in the above-described tanks in a predetermined order and dried at the drying section, and the wafer cassette thus dried is set on the stand at the carry-out opening 200B.

(2) When the wafer cassette thus cleaned is set on the stand at the carry-out opening 200B, the transfer robot 500 moves to the carry-out opening 200B, and inserts the wafer cassette into the purging station 300 through the window 2, and sets it on the bottom lid 40 of the container 30 which is set on a portion of the upper wall of the closed box 20 (hereinafter referred to as "a stand portion 20B", when applicable). In this operation, the container body 31 has been raised to a predetermined height with its handle 36 held by a holder 62 provided at the end of the rod 61 of the container body lifting unit 60.

(3) When a sensor (not shown) detects that the wafer cassette has been set on the bottom lid, the rod 61 of the container body lifting unit 60 is moved downwardly to set the container body 31 on the stand portion 20B (FIG. 2) of the purging unit in such a manner that the container body 31 is pushed against the stand portion 20B, so that the inside of the container body 31 is gas-tightly isolated from the outside.

(4) Under this condition, the electromagnetic control valves 5 and 7 are opened, so that the inert gas ($N_2$ gas in the embodiment) is jetted from the one end portion 4B of the gas supplying pipe 4 into the closed box 20, while the air in the latter 20 is discharged outside the casing 1 through the gas discharging pipe 6; that is,! the air in the closed box 20 is replaced by the inert gas.

(5) After a predetermined period of time, the lifting stand 23 is slightly lowered, so that the bottom lid 40 is disengaged from the container body opening 33; that is, the inside of the container body 31 is communicated with the inside of the closed box 20, so that the air in the container body 31 is replaced by the inert gas.

(6) In a predetermined period of time, the lifting stand is raised to the original position, and the above-described locking/unlocking mechanism (FIG. 7) operates. That is, the lock arm 45 is engaged with the recess 33A, so that the bottom lid 40 is gas-tightly engaged with the container body opening 33, and the electromagnetic control valves 5 and 7 are closed.

(7) Thereafter, the rod 61 of the container body lifting unit 60 is moved upwardly, and the arm handling robot 500A of the movable robot 500 operates to place the container 30 on the latter 500.

(8) The transfer robot 500 carries the container 30 thus purged over to the apron 400A of the clean stocker 400. Thereupon, the container handling robot 400B in the clean stocker 400 operates to move the container 30 from the apron 400A to a shelf 400C and set it on the latter 400C.

(9) Of a plurality of containers stored in the clean stocker 400, the specified one is delivered from the shelf to the tranfer robot 500 by the container handling robot 400B.

(10) The transfer robot 500 delivers the container 30 to an container interface 101 which is the carry-in and carry-out opening of the film forming deposition system 100.

(11) In the film forming deposition system 100, the wafer cassette 70 is taken out of the container 30 brought through the container interface 101, and it is delivered to a CVD oven (not shown) and so forth; that is, a thin film deposition system is carried out.

In the embodiment, the wafer cassette 70, which has been cleaned and dried in the cleaning equipment 200, is delivered to the purging station 300, where it is set in the container 30 and purged with an inert gas which is inactive with the wafers. Thus, the wafers are held in the container 30 filled with the inert gas. The wafers are exposed in the air when conveyed from the cleaning equipment 200 to the purge station 300; however, native oxide films scarcely grow on them, because the period of time for which they are exposed in the air during the conveyance is extremely short.

In the embodiment, the wafer cassette 70 set in the container is stored in the clean stocker 400. Hence, the time limitation in operation between the equipments is eliminated; that is, the troublesome requirement is eliminated that, in order to reduce the waste time of holding the cleaned wafer cassette, the cleaning operation must be performed in association with the operation of the film forming deposition system 100. In the case where the film forming deposition system has no container interface, in the clean stocker 400 the wafers are taken out of the wafer cassette 70 and delivered to the transfer robot 500. And the wafers are conveyed to the film forming deposition system 100 while being exposed in the air. In this operation, it is necessary to reduce the time of conveyance as much as possible, thereby to minimize the growth of native oxide films on the wafers.

Figure 8:
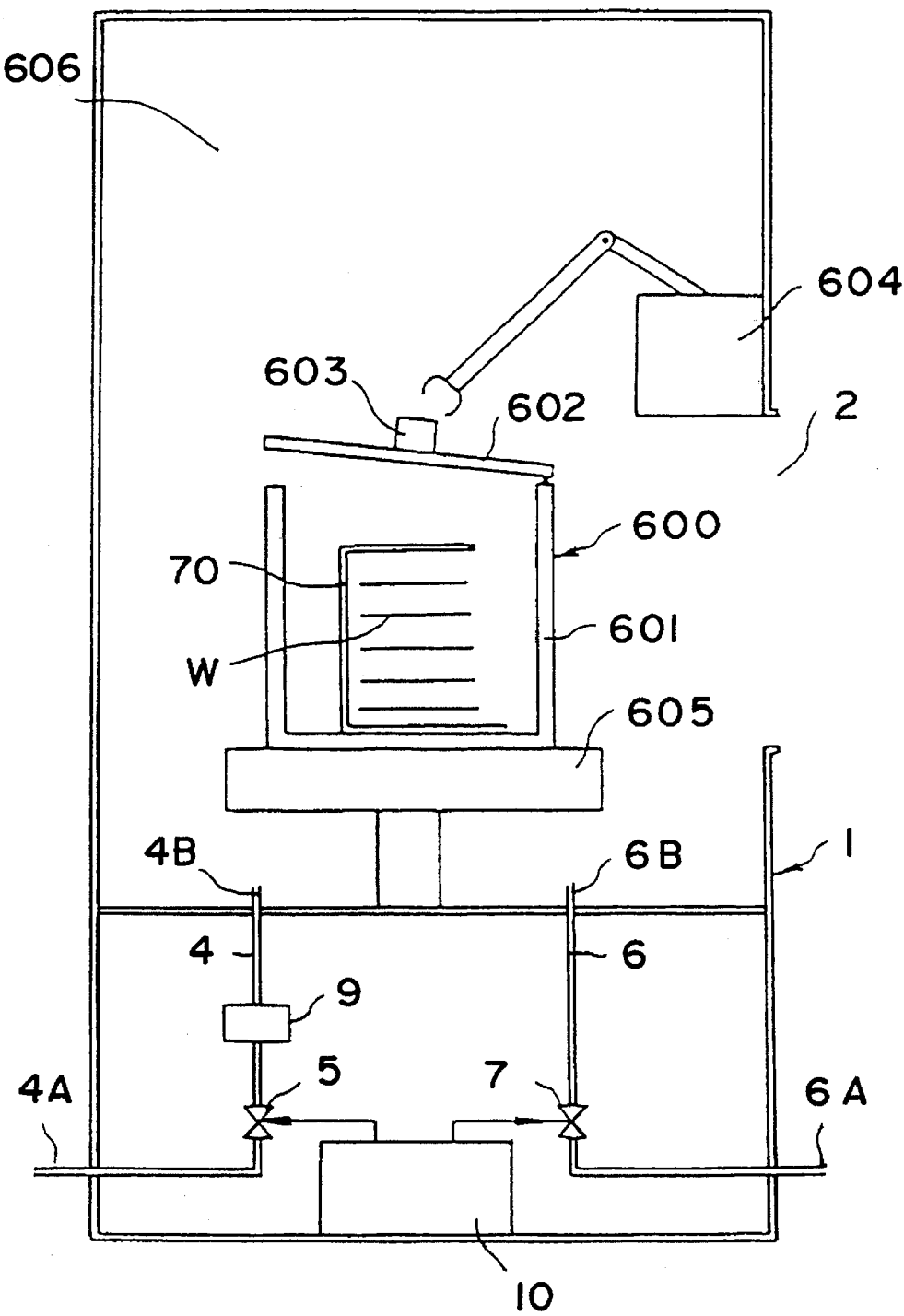
FIG. 8 is an explanatory diagram showing a second example of the purging station.

FIG. 8 shows a second example of the purging station which is provided for an upper lid type portable closed container 600.

In FIG. 8, reference numeral 601 designates a container body; 602, an upper lid; 603, a handle; 604, a lid operating (opening and closing) mechanism; 605, a stand on which the container 600 is set; and 606, a purging chamber.

Figure 9:
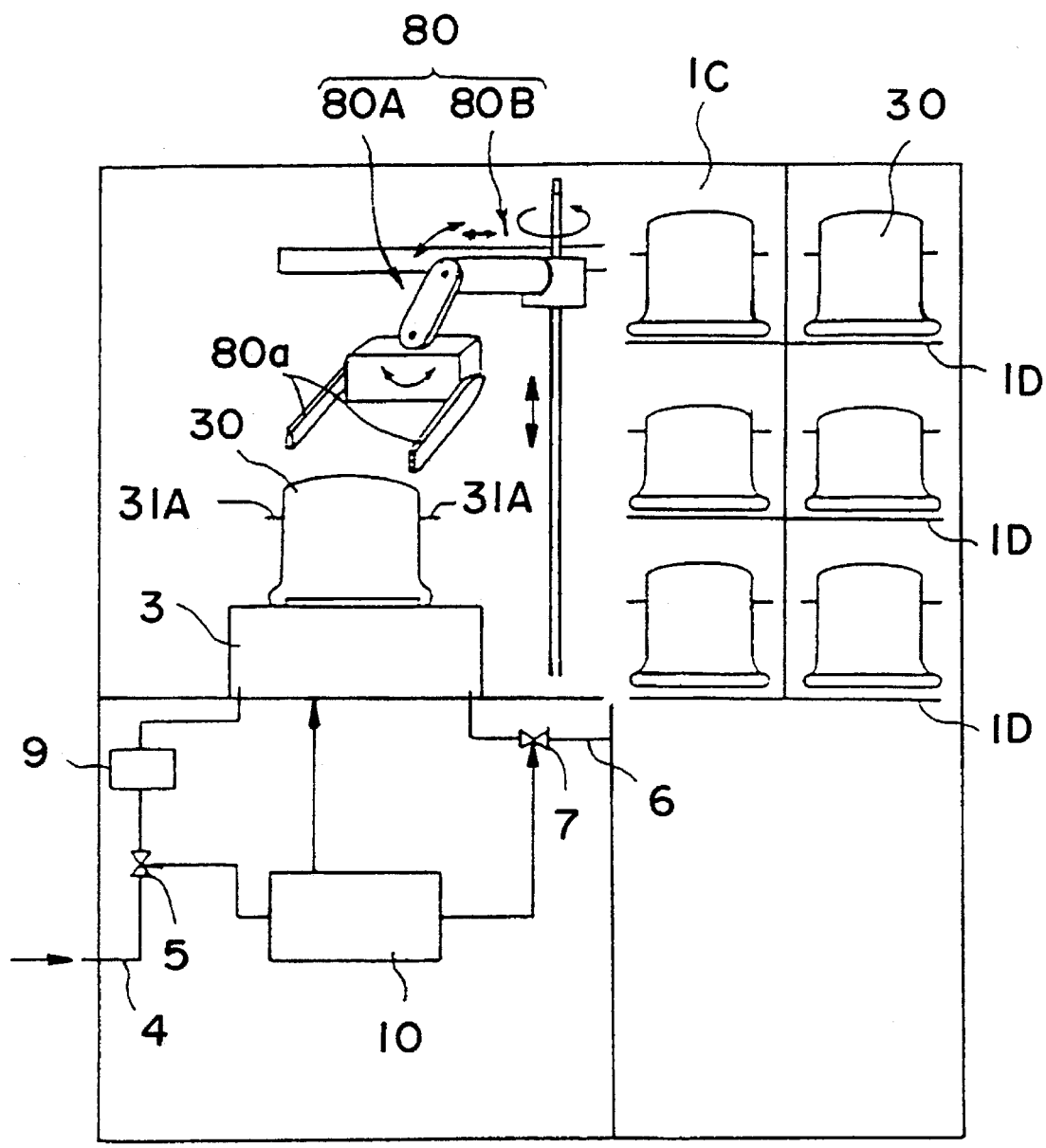
FIG. 9 is an explanatory diagram showing a third example of the purging station.
Figure 10:
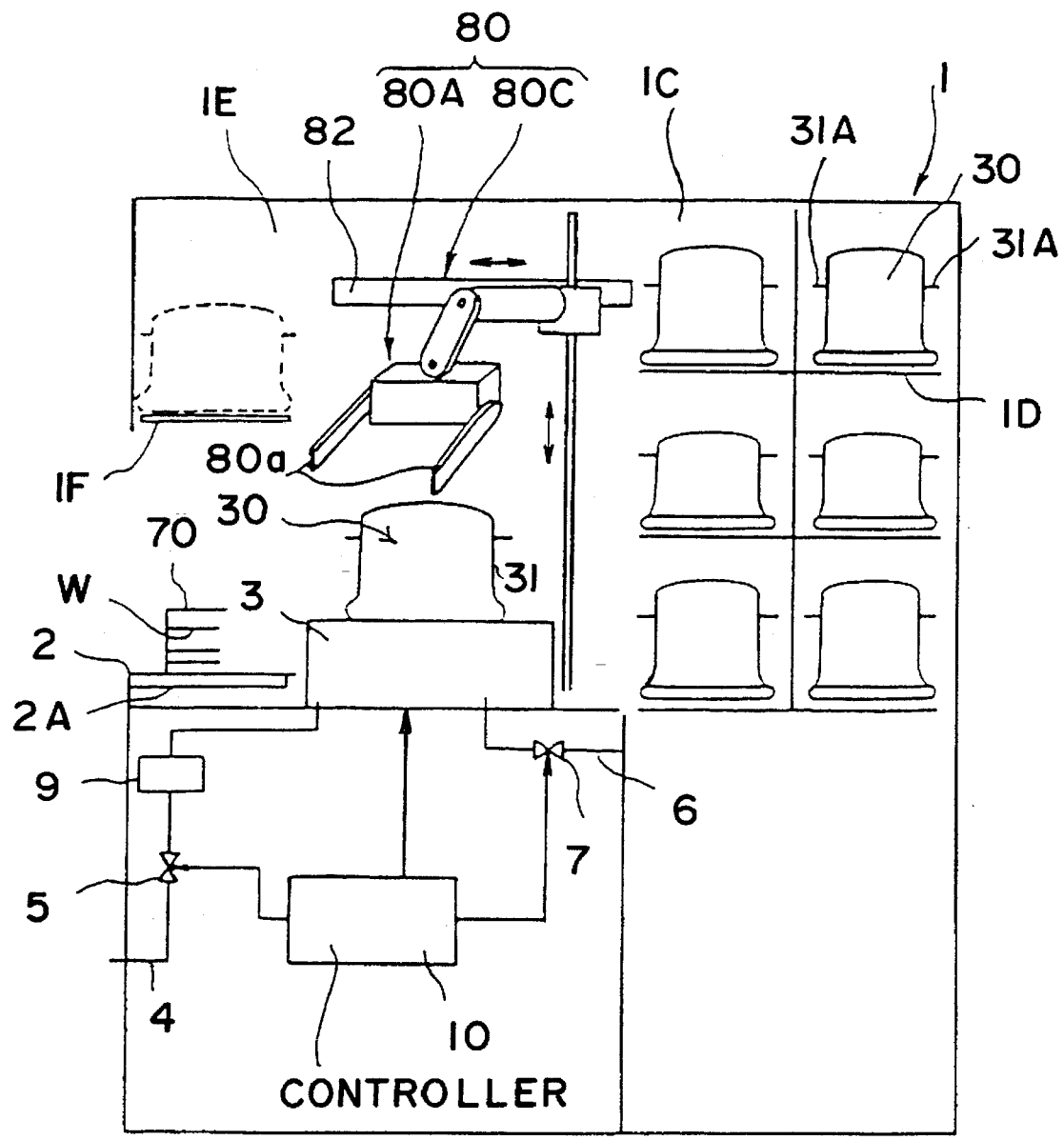
FIG. 10 is an explanatory diagram showing a fourth example of the purging station.

FIGS. 9 and 10 show third and fourth examples of the purging stations. In those purging stations, the casing 1 has a container storing section 1C, and accommodates a container handling robot 80. The container body 31 has handles 31A on its side wall.

In each of the purging stations shown in FIGS. 9 and 10, the container handling robot 80 operates to convey the container 30 between the purge unit 3 and a plurality of shelves 1D. The container handling robot 80 comprises: a hand 80A with fingers 80a; and an arm 80B adapted to turn and lift the hand 80A. The fingers 80a are engaged with the handles 31A of the container body 31.

In each of the purging stations shown in FIGS. 9 and 10, a plurality of empty containers are stored in the container storing section 1C. Therefore, when any one of the shelves 1D is specified, the empty container on the shelf 1D thus specified can be automatically set on the stand of the purging unit 3 by the container handling robot 80. That is, the purging stations are free from the troublesome operation that an empty container must be taken into the purging station from outside for every gas-purging operation.

The fourth example of the purge station shown in FIG. 10 has a cassette stand 2A near the opening, and a stand 1F on which the container body 31 is set temporarily (hereinafter referred to as "a temporary stand 1F", when applicable) in a chamber 1E where the purging unit 3 is provided.

That is, instead of the arm handling robot 500A of the transfer robot 500, the container handling robot 80 carries the wafer cassette 70, which has been delivered from the cleaning station 200, into the casing 1 and places it on the stand portion of the purging unit 3. More specifically, the arm handling robot 500A operates to place the wafer cassette 70 on the cassette stand 2A, and thereafter the container handling robot 80 operates to carry the wafer cassette 70 from the cassette stand 2A over to the purging unit 3 and set it on the stand portion of the latter 3.

Upon selection of an empty container in the container storing section 1C, it is set on the purging unit 3 by the container handling robot 80. Under this condition, the bottom lid locking/unlocking mechanism of the purging unit 3 operates to unlock the bottom lid from the container body. As a result, only the bottom lid is left on the purge unit 3, while the container body 31 is set on the temporary stand 1F by the container handling robot 80. That is, the purging station is placed in standby state waiting for the arrival of a wafer cassette. The empty container 30 may be set on the temporary stand 1F as well as the container body 31. That is, the container unit gas-purged may be temporarily placed on it.

In the fourth example of the purging station shown in FIG. 10, one container handling robot 80 conveys the wafer cassette 70, conveys the container 30, sets the wafer cassette 70 in the container, and lifts the container body 31.

In the above-described purging stations, the container storing section 1C is provided for empty containers; however, it may be used for storing the containers gas-purged; that is, it may be used as a container clean stocker. In this case, the purging station should be provided with means for suitably discriminating the empty containers and the containers containing wafer cassettes.

Figure 11:
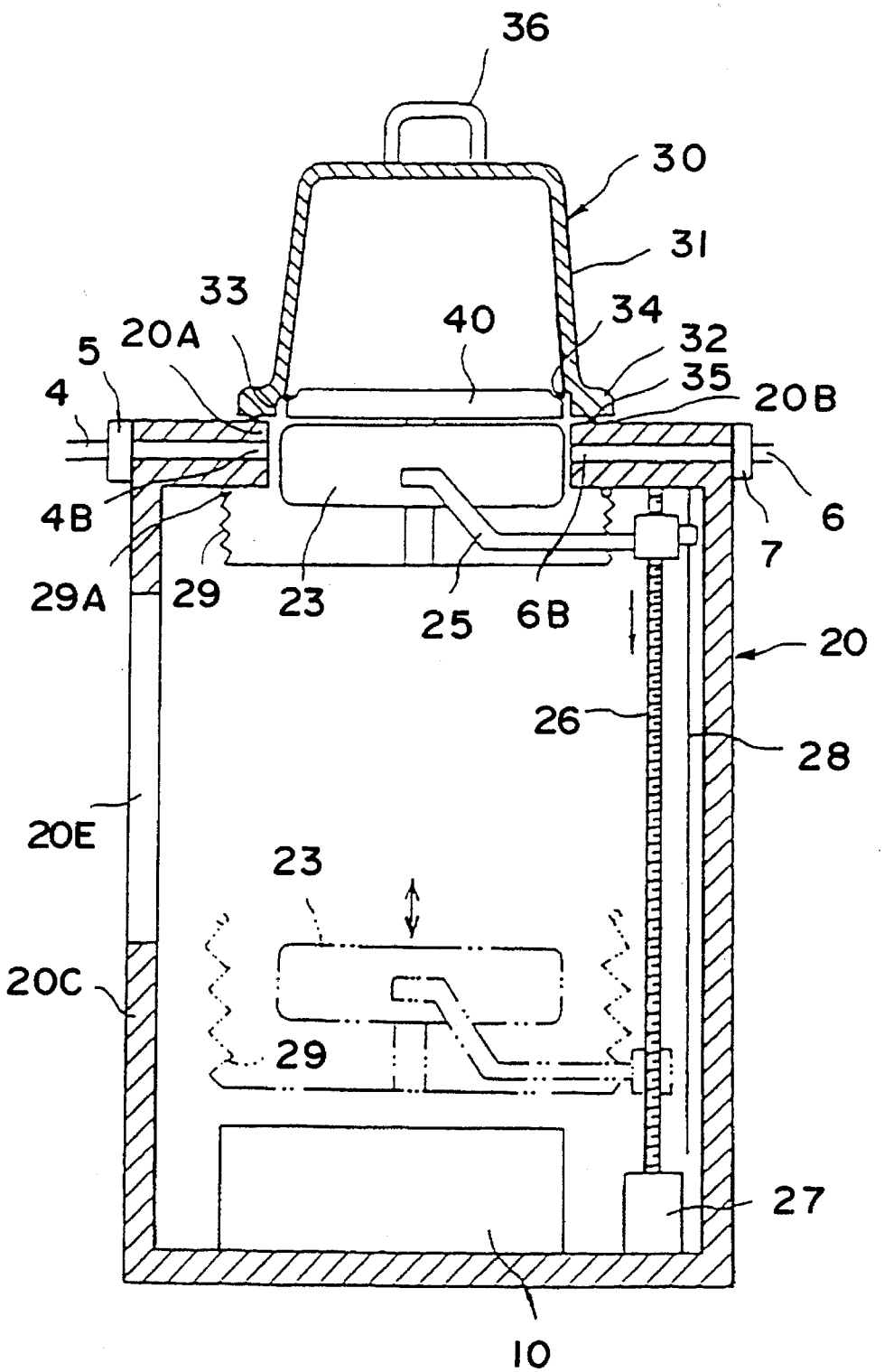
FIG. 11 is an explanatory diagram showing a fifth example of the purging station.

FIG. 11 shows a fifth example of the purging station. In the purging station, instead of the casing 1, a closed box 20 is used. The closed box 20 has a opening 20 in a side wall 20C, through which a wafer cassette is carried in and out of the closed box 20. When a wafer cassette 70 is carried in and out of the closed body 20, the lifting stand 23 is lowered to a position as indicated by the two-dot chain line.

In the purging station of FIG. 11, similarly as in the case of the second example of the purging unit shown in FIG. 4, a bellows type skirt 29 defines a purging-chamber. The gas-purging operation is carried out under the conditions that the lifting stand 23 is raised near the uppermost position, and the bellows 29A of the skirt 29 is pushed against the rear surface of the stand portion of the upper wall of the close box 20.

In the above-described embodiment, the purging station is separate from the cleaning equipment. However, as shown in FIG. 12, the cleaning equipment 700 may have a purging function.

Figure 12:
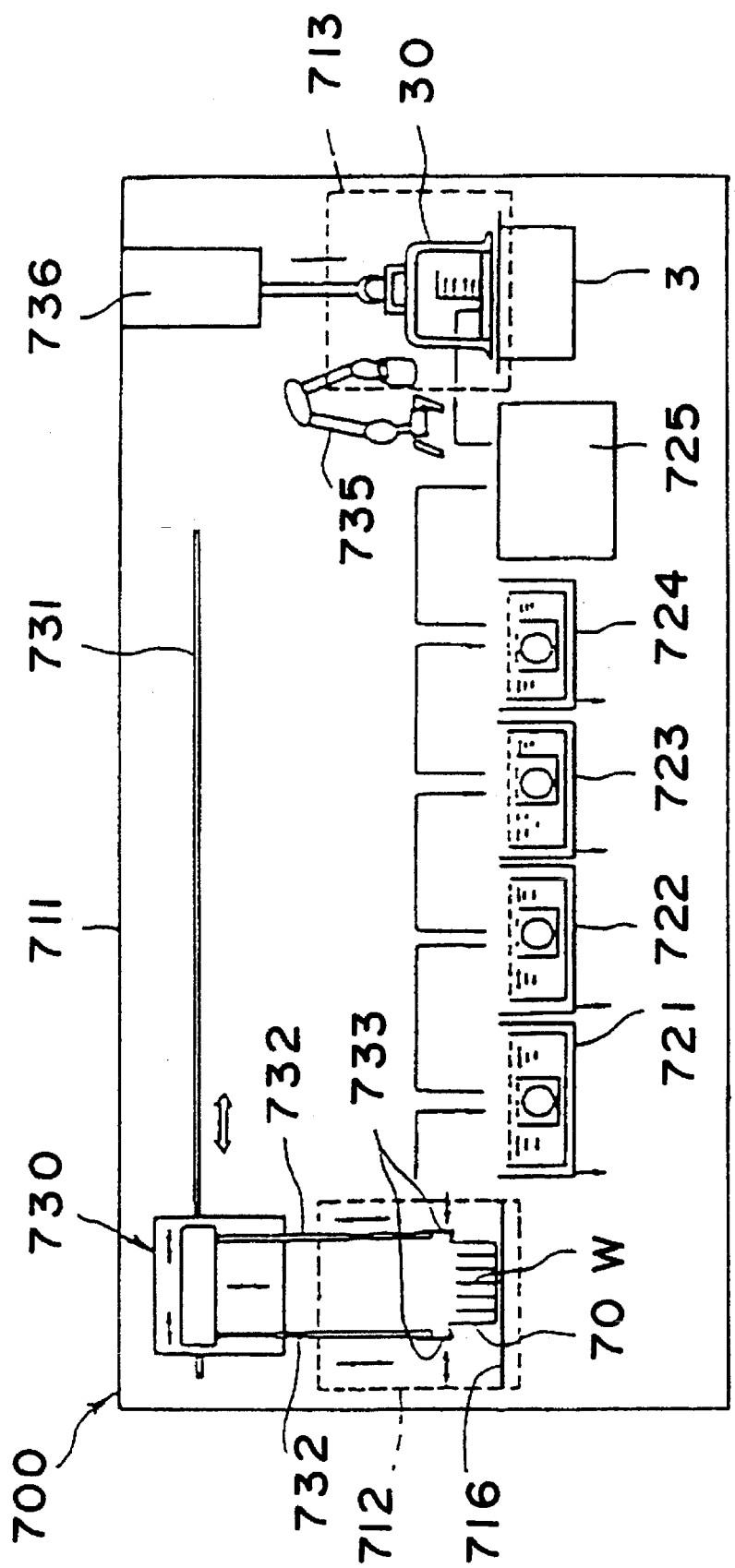
FIG. 12 is an explanatory diagram showing a first example of a cleaning equipment having a purging function.

In FIG. 12, reference numeral 711 designates a casing; 712, a cassette carry-in opening formed in the front wall 711A of the casing 711; 713, a container carry-out opening formed in the front wall 713; 716, a cassette stand; 721 through 724, chemical solution tanks; 725, a drier; and 730, a product transferring robot with handling arms 732. The product trasferring robot 730 is engaged with a rail 731 so that it is horizontally movable. Further in FIG. 12, reference numeral 733 denotes hands which are engageable with the ears of the wafer cassette 70; 735, a product transferring robot which operates to take a wafer cassette 70 from the drier 725, and place it on the purging unit 3; and 736, a container body lifting unit.

Figure 13:
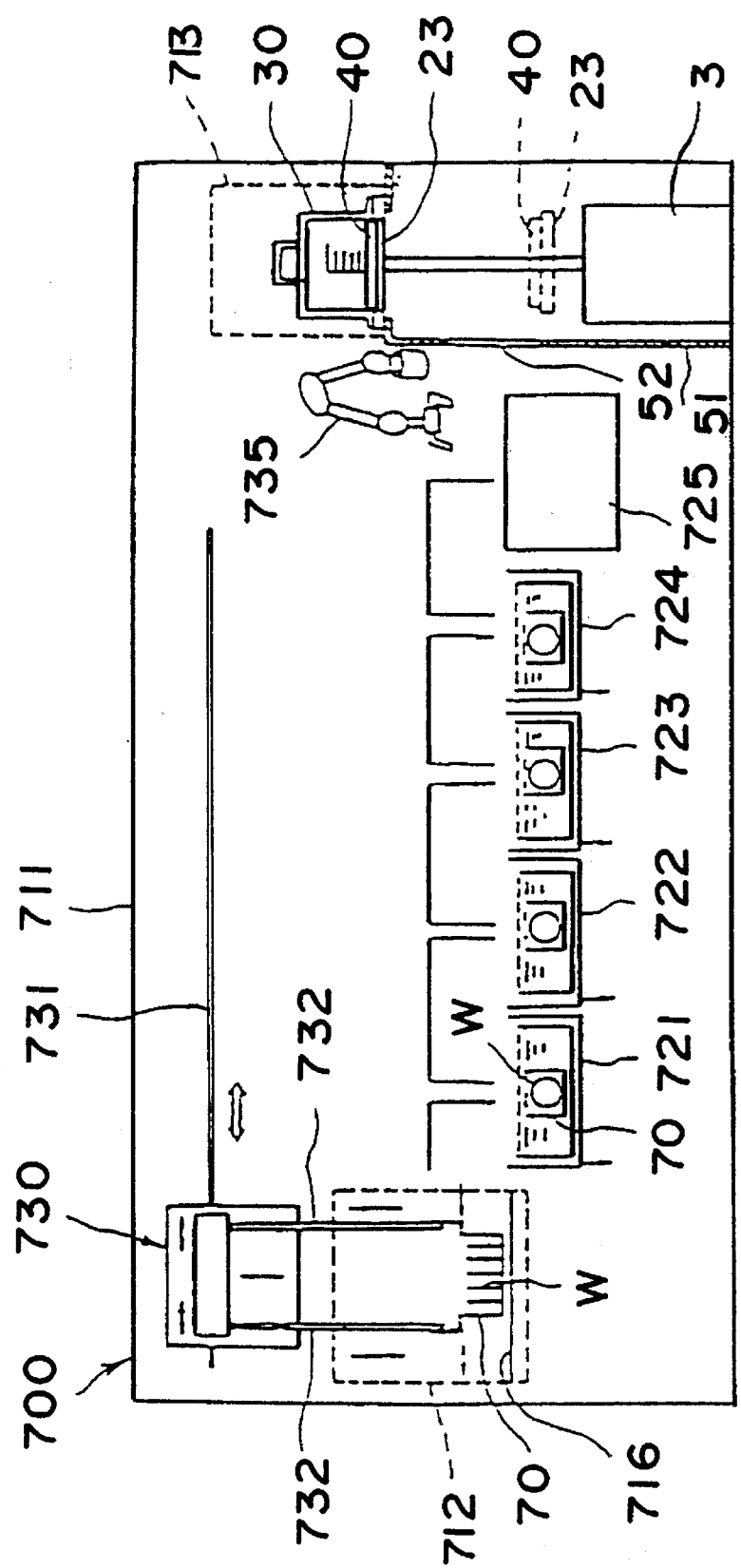
FIG. 13 is an explanatory diagram showing a second example of the cleaning equipment.

FIG. 13 shows a second example of the cleaning equipment with the purging function.

The cleaning equipment of FIG. 13 is provided with a purging station similar to the one shown in FIG. 11. In the cleaning equipment, a opening 52 with a gas-tight door, through which a wafer cassette is carried in, is formed in the wall of the drier 725 which wall is closer to a closed box 51. The wafer cassette 70 taken out of the drier 725 is carried into the box 51 through the opening 52, and placed on the bottom lid 40 on the lifting stand 723.

The cleaning equipment shown in FIG. 13 is different from the one shown in FIG. 112 in the following points: The cleaning equipment of FIG. 13, unlike the one shown in FIG. 12, has no container body lifting equipment 736 (FIG. 12), and therefore the stroke of the lifting stand 23 is increased as much; that is, the bottom lid 40 can be moved vertically in a wider range to carry in the cassette 70.

In this case, the purging station shown in FIG. 11 may be employed as it is, being most suitable for the case where the consumption of the inert gas cannot be neglected.

Figure 14:
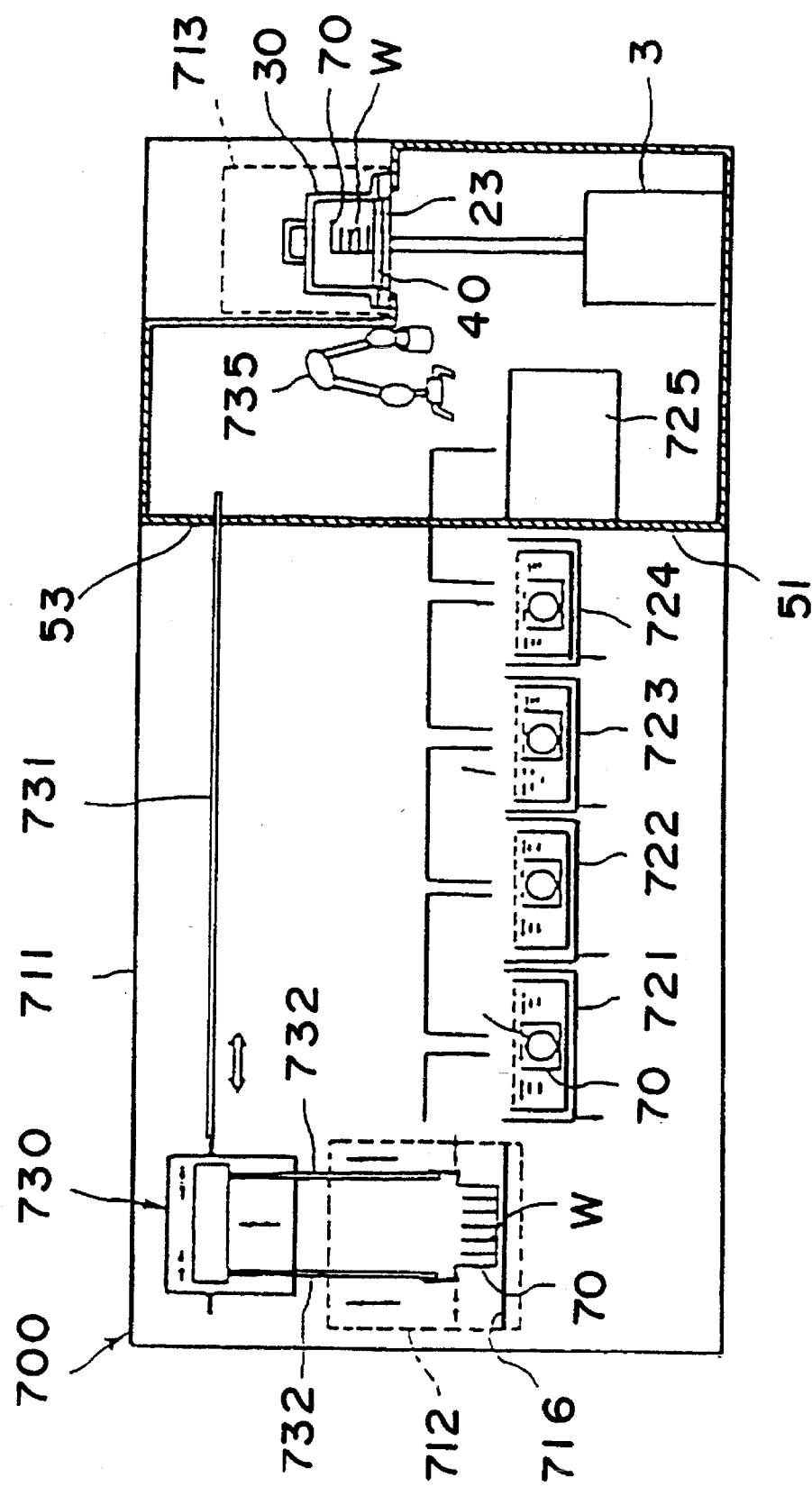
FIG. 14 is an explanatory diagram showing a third example of the cleaning equipment.

FIG. 14 shows a third example of the cleaning equipment having the purging function.

A specific feature of the cleaning equipment shown in FIG. 14 resides in that the closed box is larger in volume, and the drier 25 and the wafer cassette transferring robot 735 are provided in the closed box. The drier 725 is for instance a spin drier. The wafer cassette can be dried in a purging gas atmosphere (it is applicable for employing a dry air from which a moisture is removed); that is, the drying operation and the purging operation can be achieved without exposure of the wafer cassette in the air.

Figure 15:
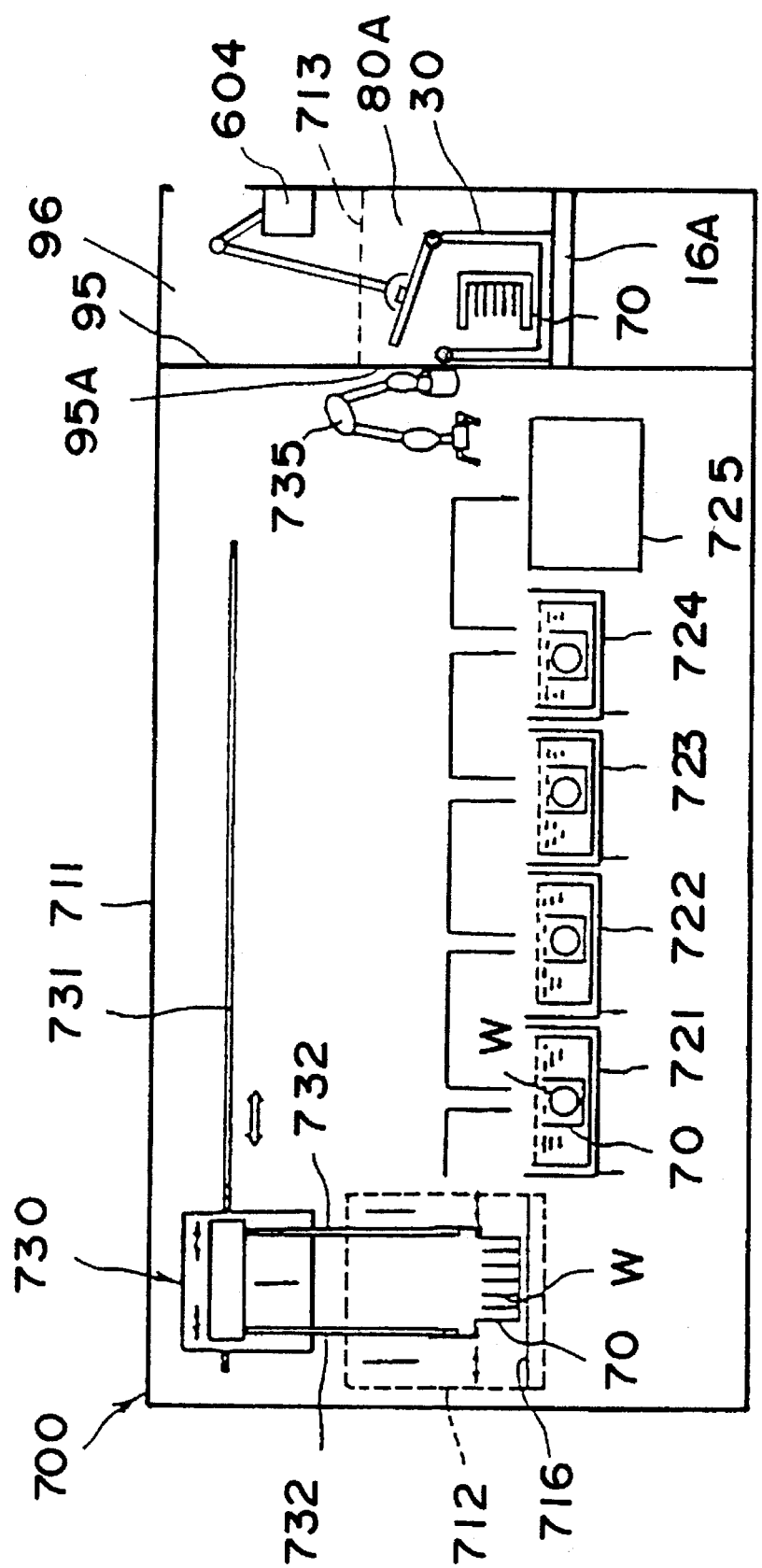
FIG. 15 is an explanatory diagram showing a fourth example of the cleaning equipment.

FIG. 15 shows a fourth example of the cleaning equipment having the purging function. In the case of FIG. 15, the upper lid type container is employed.

The fourth example of the cleaning equipment employs the purging station shown in FIG. 8. In the casing 11, a partition wall 95 is formed to define a purge chamber 96, and a cassette or container placing opening 95A with a gas-tight door is formed in the partition wall 95.

In the cleaning equipment of FIG. 12, a wafer cassette transferring robot 735 operates to move a wafer cassette 40 from the drier 25 into the upper lid type container 60. The upper lid type container 60, after being closed by a lid operating (opening and closing) mechanism 604 and gas-purged, is taken out of the purging chamber 96 and moved out of the cleaning equipment by the wafer cassette transferring robot 735.

In the above-described embodiment, the wafer cassette 70 is stored in the clean stocker 400; however, it may be stored at a predetermined place in the clean room instead of the clean stocker 400.

It is not always necessary to store the gas-purged container in the clean stocker 400; that is, depending on the advancement of the process, it may be conveyed from the purging station to the film forming deposition system, or to a storing place provided near the latter. In this case, the container itself serves as storing means. Furthermore, the purging station may have a store room, which is used instead of the clean stocker 400.

In the above-described embodiments of the invention, the gas-purging operation is carried out by using an inert gas such as $N_2$ gas; however, it may be carried out by using dry air or heated $N_2$ gas. Sometimes the container 30 is evacuated before gas-purged (cf. FIGS. 5 and 6). In the evacuation of the container 30, in addition to the pipe 4 connected to the inert gas source, a pipe connected to a vacuum source is connected to the closed box 20.

As was described above, in the electronic substrate processing system of the invention, semiconductor substrates such as wafers are not exposed in the atmosphere in the clean room when they are conveyed from equipment to equipment or from processing station to processing station or when stored. Hence, the wafers are positively prevented from contamination, and the time limitation in operation between the equipments in the system is eliminated; that is, the processing operation is increased in the degree of freedom. Thus, the electronic substrate processing system of the invention is much higher in productivity than the conventional one.

What is claimed is:

1. A purging station comprising:

an independent casing having a container carry-in/carry-out opening;

a purging unit provided in said casing, said purging unit having a container stand;

a portable closed container including a container body and a bottom lid for storing and conveying a cassette which accommodates electronic substrates, said cassette being placed on said container stand;

a container body lifting unit for lifting said container body;

purging pipes first ends of which are opened in said purging unit; and a purging control unit for controlling said purge station wherein said purging unit incorporates a purging mechanism which operates to open and close said bottom lid of said container on said container stand to selectively communicate the inside of said container with the inside of said purging unit.

2. A purging station as claimed in claim 1, wherein said casing includes:

a mechanism for forming a stream of air in one of a vertical, horizontal and lateral direction, said stream of air being caused to flow through a filter and to flow out of said casing through one of said carry-in/carry-out opening and a gas discharging opening.

3. A purging station as claimed in claim 1, wherein said casing has a container storing chamber, and said container body lifting unit moves said portable closed container from said container storing chamber to said container stand of said purging unit.

4. A purging station as claimed in claim 1, wherein said casing has a temporary stand on which said portable closed container is temporarily placed, and said container body lifting unit moves said portable closed container from said temporary stand to said container stand of said purging unit and moves said portable closed container from said container stand to said temporary stand and placing said container.

5. A purging station as claimed in claim 1, said portable closed container is purged with one of a gas which is inactive with said electronic substrates in said cassette, an inert gas being heated, an inert gas after said container being evacuated and a heated inert gas after being evacuated.

6. A purging station comprising:

an independent casing having a container or cassette carry-in/carry-out opening;

a container stand provided in said casing;

a portable closed container, including a container body and a bottom lid, for storing and conveying and a cassette which accommodates electronic substrates, said cassette being placed on said container stand;

a container lid opening and closing mechanism for opening said bottom lid;

purging pipes first ends of which are opened in said casing; and a purging control unit for controlling said purging station, said portable closed container being purged with one of a gas which is inactive with said electronic substrates in said cassette, an inert gas being heated, an inert gas after said container has been evacuated and a heated inert gas after said container has been evacuated.

7. A gas-purging equipment comprising;

a portable closed container for accommodating and conveying electronic substrates;

a gas purging unit for evacuating and subsequently purging said portable closed container with a gas which is inactive with said electronic substrates, said gas-purging unit being connected through pipes to a vacuum source and an inert gas source, and said gas-purging unit being divided with a wall to form a gas-purging unit body and a container accommodating section, said wall having a through-hole through which said gas purging unit body section and said Container accommodating section are communicated with each other, wherein after said portable closed container is set on said wall, said bottom lid of said container is opened so as to communicate said inside of said container with said inside of said gas-purging unit body, whereby said inside of said portable closed container is evacuated and purged with one of an inert gas and a heated inert gas, said gas-purging equipment corresponding to a box, and said container accommodating section being in the form of a semi-spherical cover setting on said box.

8. A purging station comprising a purging chamber provided in a purging unit having an opening, a periphery of said purging unit serving a container stand on which a portable closed container is set;

purging pipes, first ends of which are opened in said purge chamber;

a purging control unit for controlling said purge unit; and a purging mechanism for opening and closing said bottom lid of said container on said container stand to selectively communicate an inside of said container with an inside of said purging chamber, wherein said purging chamber is defined in said purging unit, which includes an independent casing, by a skirt that said skirt gas-tightly covers aid opening of said purging unit from inside, and said casing includes a cassette carry-in/carry-out opening, and wherein said portable closed container is purged with one of a gas which is inactive with said electronic substrates in said cassette, an inert gas being heated, an inert has after said container has been evacuated and a heated inert gas after said container has been evacuated.

* * * * *